United States Patent [19]

Blass et al.

[11] Patent Number: 4,613,837

[45] Date of Patent: Sep. 23, 1986

[54] MULTIPLE FEED RF COILS

[75] Inventors: Judd Blass, Petuach; Hanan Keren, Saba, both of Israel

[73] Assignee: Elscint, Ltd., Haifa, Israel

[21] Appl. No.: 668,944

[22] Filed: Nov. 7, 1984

[51] Int. Cl.[4] .......................... H01P 7/00; G01V 3/14
[52] U.S. Cl. ................................. 333/219; 333/24 R; 333/32; 333/235; 324/318; 128/653
[58] Field of Search .......... 324/307; 333/24 R, 24 C, 333/32–33, 219, 231, 235, 245; 128/630, 653

[56] References Cited

U.S. PATENT DOCUMENTS 3,953,789  4/1976  Veeman et al. ..................... 324/310

Primary Examiner—Marvin L. Nussbaum
Attorney, Agent, or Firm—Sandler & Greenblum

[57] ABSTRACT

An Rf coil arrangement for MRI systems wherein the electrical length is reduced to improve the S/N ratio and the Rf power efficiency.

11 Claims, 7 Drawing Figures

MULTIPLE FEED RF COILS

FIELD OF THE INVENTION

This invention is concerned with Radio Frequency coils or probes and more particularly with such coils used in Magnetic Resonance Imaging (MRI) Systems.

BACKGROUND OF THE INVENTION

In MR Imaging systems radio frequency coils are used to transmit the radio frequency signals which nutate nucluei that have been aligned by the static magnetic field. After the Rf signal is removed, the nutated nucluei subsequently return to their aligned positions. During this return the free induction decay (FID) signals are generated. These signals are detected by Rf coils and provide the image data used to generate the display images.

It is understandably extremely important that the RF coils be efficient in the transmission of Rf power signals with a maximum signal to noise ratio. The prior art basically uses shaped wire coils. The prior art coils are coupled to the Rf modulator at one point in the coil. It would be advantageous both from a power efficiency stand-point and from a signal-to-noise ratio stand point to improve the over-all efficiency of Rf probes used in MRI system. Improvements in power efficiency and in th signal-to-noise ratio effect the readability and resolution of the images obtained from the MRI system.

Accordingly it is an object of the present invention to provide improved Rf coils for MRI systems.

In accordance with the present invention an improved Rf probe for MRI systems is provided, said probe comprises:

a loop for generating a magnetic field responsive to the passage of a varying current at Larmor frequencies, means for coupling electro-motive forces (EMF) to said loop to cause the passage of current through said loop, and said coupling means comprising at least two feed points in said loop whereby the EMF causes the current to flow from the instantaneous positive voltage at the first feed point to the instantaneous negative voltage at the second feed point and from the instantaneous positive voltage at the second feed point to the instantaneous negative voltage at said feed first point.

A feature of the invention provides for decreasing the electrical length of the Rf coil while at least maintaining the magnetic strength of the magnetic field generated by the Rf coil. Another feature of the invention provides for decreasing the Re of the probes where Re is the loss due to the coupling to the lossy dielectric material in the specimen being imaged.

The aboved named and other objects of the present invention will be best understood when considered in the light of the following description of the invention taken in conjunction with the following drawings; wherein.

GENERAL DESCRIPTION

Figure 1:
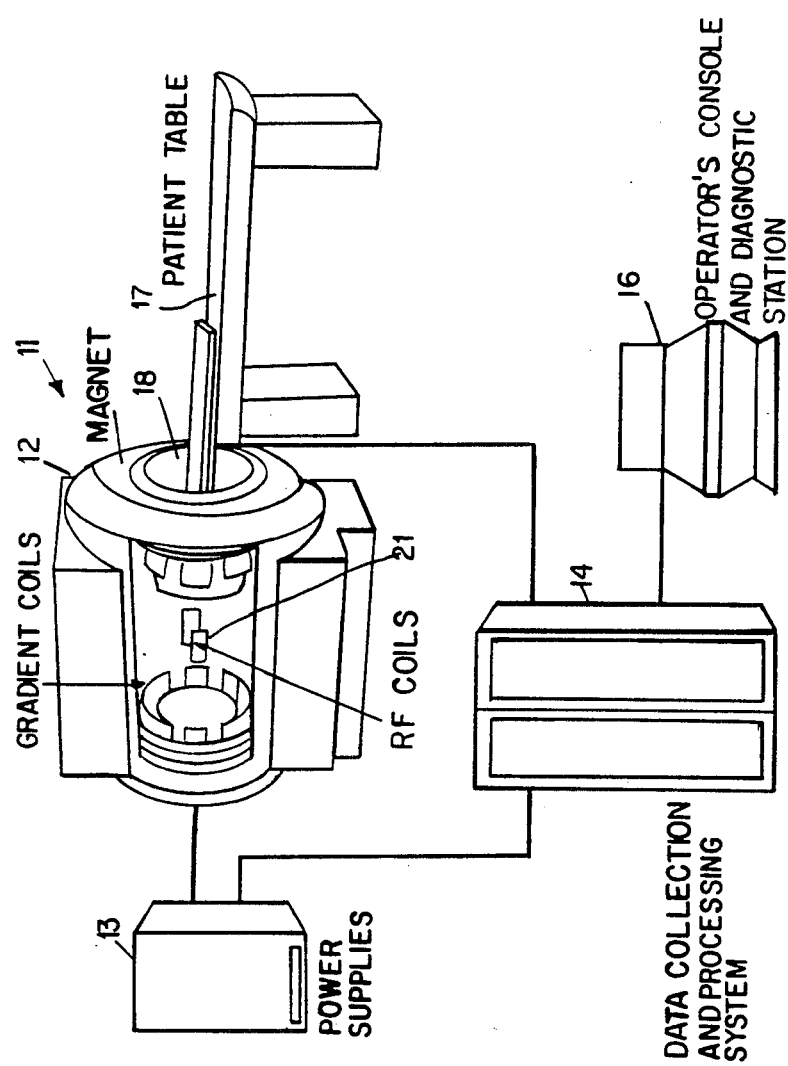
FIG. 1 is a pictorial block diagram of a generalized MRI system.

Typical MRI systems such as shown in FIG. 1 at 11 include a main static magnetic 12 which is powered or initially powered by a power supply shown at 13. The magnet may be any type of magnet well known to those skilled in the art, i.e. either a super-conductive, permanent or resistive type magnet. The data collection and processing system is shown generally at 14 with the operator's console and diagnostic station shown at 16. The system includes the patient's table 17 which is used to insert the patient within the bore 18 of the magnet. The system includes gradient coils shown generally at 19 and Rf coils shown at 21 which may be used both for transmitting and receiving the Larmor Rf signals.

Figure 2:
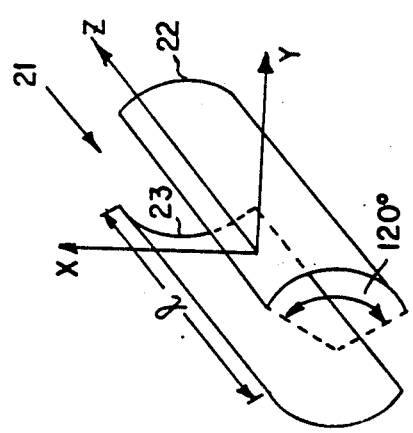
FIG. 2 is a more detailed showing of the radio frequency (Rf) coils of FIG. 1.

This invention is concerned with improving the general performance of the Rf coils or probe 21. The Rf coils 21 are shown in greater detail in FIG. 2. When the main static field is along the Z axis and the patient is positioned along the Z axis then it is usual for the RF coils to be saddle shaped. You will note that the longitudinal direction of the Rf coil is also along the Z axis, while the Y axis is radial i.e., perpendicular to an axial central line through both the Rf coils. The coils are shown spaced apart from and separated by the X axis, such that the XZ plane is mid-way between the coils when the YZ plane bisects the coils, and the YX plane is perpendicular to the other two planes. The coils are arcuate and are shown as encompassing 120 degrees each. The coil in FIG. 2 are shown as comprising a pair of coils 22 and 23.

Figure 3:
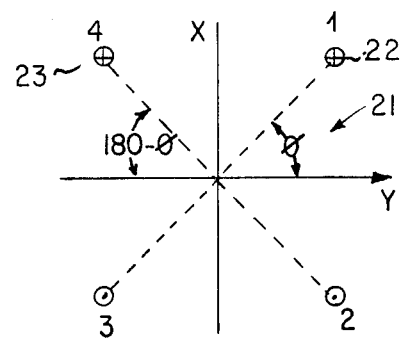
FIG. 3 is a schematic showing of the current direction in the Rf coils of FIG. 2.

In FIG. 3 the direction of the current is shown. It should be noted that while the Rf coils 21 are shown herein as being bisected by the YZ plane they could be placed so as to be bisected by the XZ plane. Coil 22 comprises wires 1 and 2 with the current going in the direction of the Z axis as shown in FIG. 2, in wire one and going in the opposite direction in wire 2. Similarly in the top wire of the coil 23, that is wire 4, the current is in the direction of the Z axis and in the opposite direction in wire 3. Wires 1 and 3 make up coil 22, and wires 3 and 4 make up coil 23. In the example shown angle $\phi$ is 60 degrees.

Figure 4:
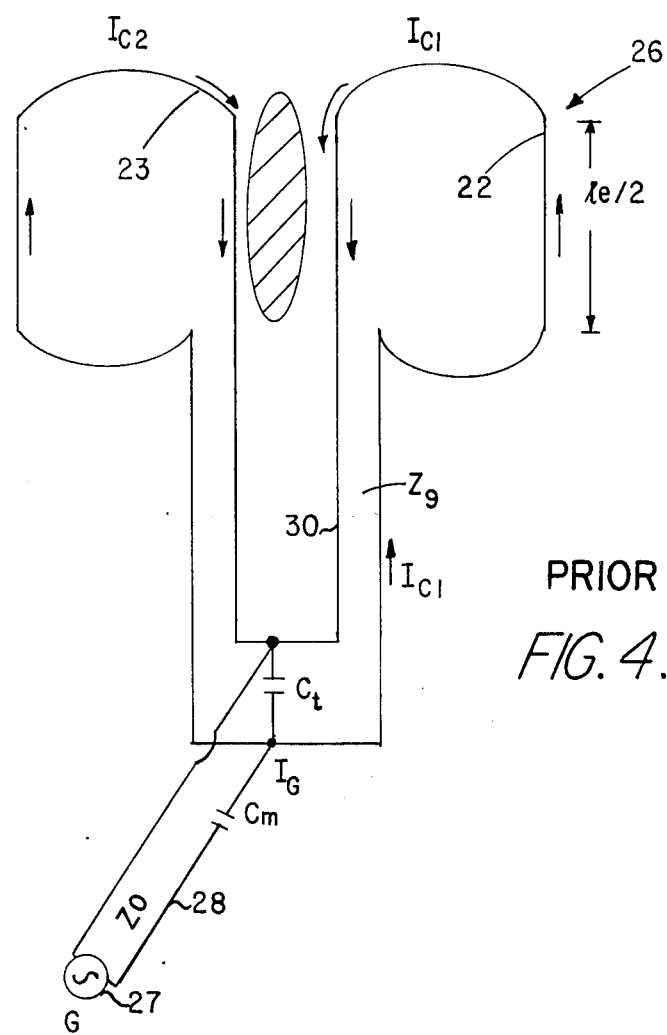
FIG. 4 is a schematic showing of the prior art connection of the Rf coils.

The coil arrangement 26 of FIG. 4 is a prior art coil arrangement. Therein a generator 27 providing Larmor frequency pulses is shown at 27. The generator is connected over conductor 28 and the matching capacitors Cm to both coils 22 and 23. The coils are tuned by a capacitor Ct shown between the conductors 29 and 30 which go to both coils 22 and 23. The impedance of the parallel connected coils is shown as Zo. The current is shown as Ic 1 and Ic 2 in coils 22 and 23, respectively. The current at the generator Ig splits into the currents Ic 1 and Ic 2.

Figure 5:
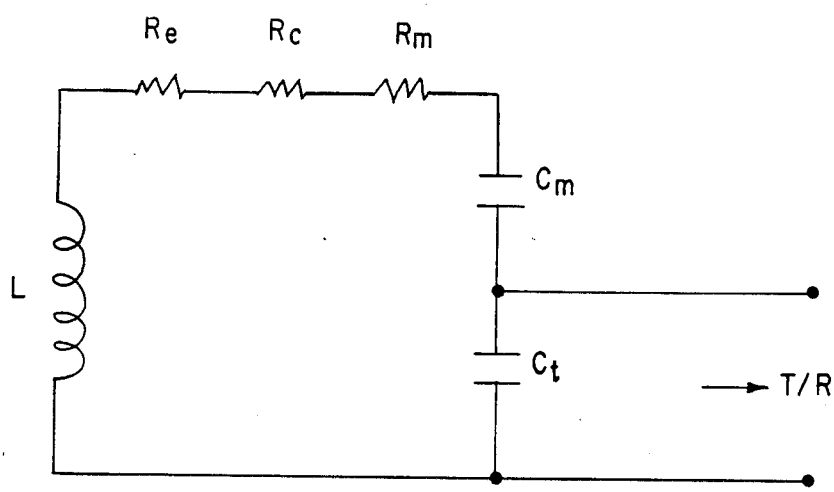
FIG. 5 is a simplified schematic showing of an equivalent circuit of an Rf coil.

FIG. 5 shows an equivalent circuit of an Rf coil. Therein L is the inductance of the Rf coil, Cm is a matching capacitor, Ct is a tuning capacitor. The resistive components are shown as Re, Rc and Rm.

The resistor Re has already been described. It represents the resistance due to coupling to the lossy dielectric material in the specimen being imaged. The resistor Rc represents the copper losses in the coils including losses doe to the solder joints, the finite Q of the matching capacitor Cm and dielectric losses in the coil support structure (not shown). The resistor Rm represents the eddy current resistance produced by the magnetic excitation of the molecules in the speciment being imaged.

The MRI process depends on the magnetic excitation of the subject thus Rm is inherently irreducible. The coil's copper losses Rc are minimized by steps such as using low loss material, high Q matching cpacitors and using low resistance electrical bonding. The resistance represented by resistor Re in no way contributes to the MR image. When the Rf coil is in the receiving mode Re is a source of noise; when in the transmitting mode Re is a "sink" for power dissapation. Thus it is worthwhile to reduce the resistance represented by Re.

The benefits of decreasing Re are more clearly demonstrated by examining the effects of frequency on the efficiency of the Rf coils, which can be expressed in terms of the three resistors of FIG. 5.

Efficiency $(Eff)_2 = RM/(Rm + Rc + Re)$ (1)

$Rm = Rmo \, (f/fo)_3$ (2a)

$Re = Reo \, (f/fo)$ (approx.) (2b)

$Rc = r1sq \, rt(f/fo) + r2 \, (f/fo)$ (approx.) (2c)

where: Rmo and Reo are eddy current and dielectric loss resistance components at fo, a reference frequency. The term r1 is a constant relating to the skin effect resistance and the term r2 is a constant relating to the tuning capacitor Q.

The equations (2b) and (2c) are approximations since they ignore certain higher order terms (which are really not relevant). Note that Re becomes more dominant relative to the other terms of the equation as the frequency increases. Thus to improve the efficiency of the Rf coils, especially at higher magnetic field strengths it is imperative to reduce Re.

Figure 6:
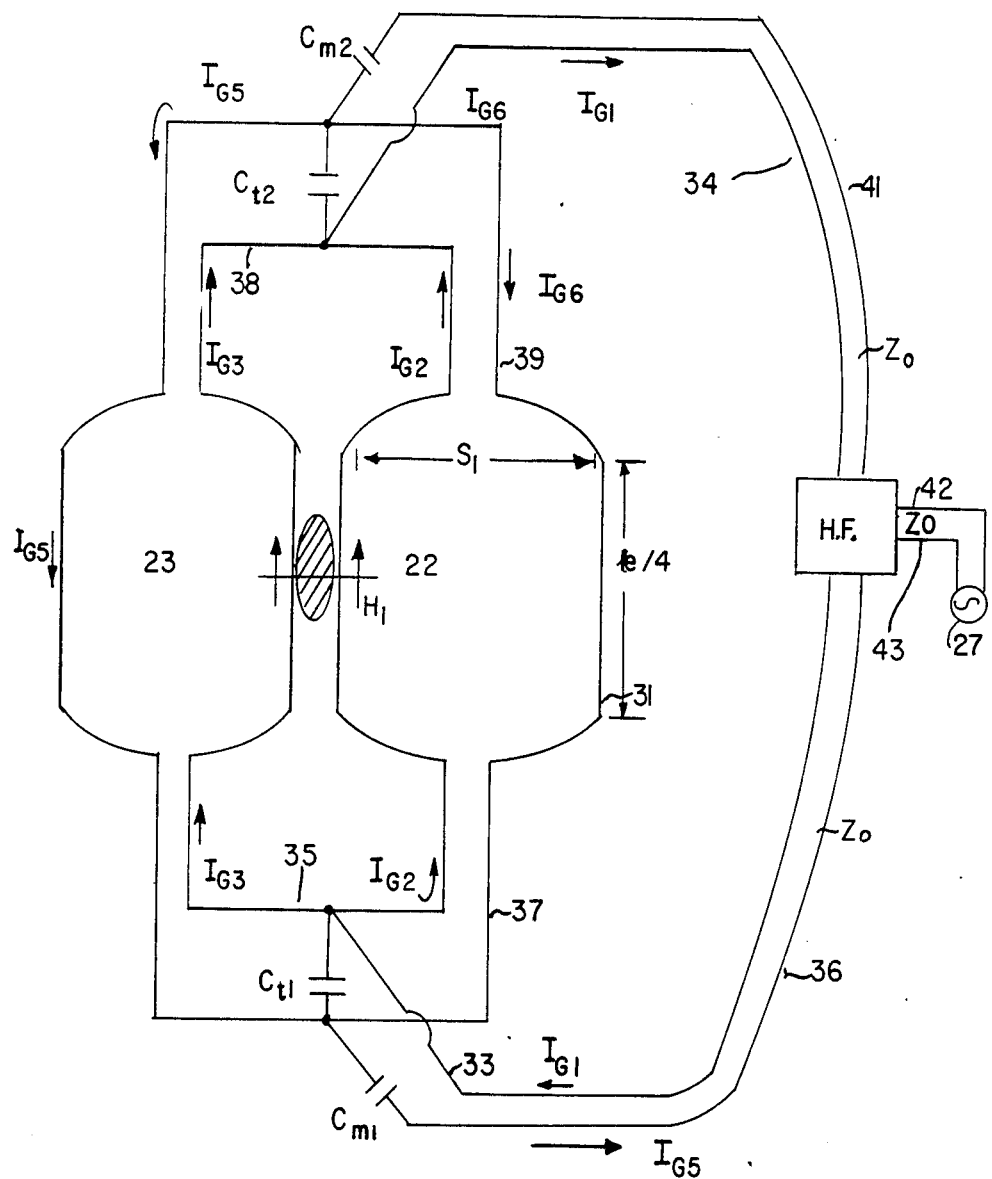
FIG. 6 is a schematic showing of the connection of the Rf coils according to the present invention.

FIG. 6 is a showing of a preferred embodiment of inventive Rf coil arrangements designed to reduce Re. Herein coils 22 and 23 are shown connected to the generator 27 through hybrid circuit 31. The hybrid circuit is connected to opposite sides of each of the coils through conductors 33, 34 and capacitors Cm1 shown at the bottom of the drawing and capacitor Cm2 shown at the top of the drawing. Currents Ig1 and Ig2 are carried by conductors 33 and 34 to conductors 35 and 38.

The hybrid 31 is also coupled to the coils through conductor 36, capacitor Cm1 and conductor 37 to the outer wire of both coils 22 and 23, and from the outer wires to conductor 39, capacitor Cm2 and conductor 41 to the hybrid. The inner and outer conductors to coils 22 and 23 i.e. conductors 35 and 37 as well as conductors 38 and 39 are joined by tuning capacitors Ct1, and Ct2 respectively. The Rf generator is coupled to the hybrid 31 over conductors 42 and 43. It can be shown that Reo is proportional to "le" cubed where "le" is the electrical length of the coil that generates the magnetic field that couples to the subject. The electrical length of a single point symmetrically fed saddle shaped coil (FIG. 4) is double to that of the same coil fed at two symmetrical points. The length can be shortened even more by eliminating the curved saddle sections such as section S1.

The double feed connection creates two short circuited planes; parallel to the YZ and XY planes. These short circuited planes; i.e., tangential effective fields equal to zero automatically greatly reduce the electrical field coupling.

The short circuited planes are geometric; i.e., unaffected by probe tuning or phasing.

Figure 7:
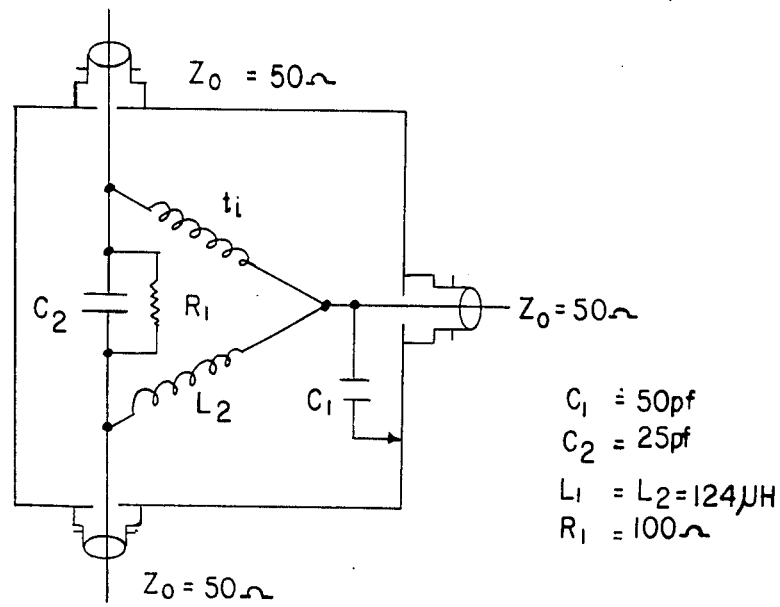
FIG. 7 is a preferred embodiment of a hybrod used in FIG. 5.

FIG. 7 shows a preferred embodiment of the hybrid. The hybrid comprises a pair of inductors L1 and L2 which are separated by capacitor C2. The junction of the inductors L1 and L2 are connected through capacitors C1 to the shield of the cabling of the hybrid circuit. The values are selected so that there is as equivalent impedence of 50 ohms at each of the outputs. In a preferred embodiment C1=50 Pf, C2=25 Pf, and L1=L2 equal 104 microhenries.

Within the scope of the invention many coil configurations are possible. Some of these are:
1. Saddle coils with two feeds, fed by hybrid power divider.
2. Surface coils with two feed points fed by a hybrid power divider.
3. Double surface coil with four feed points, and
4. Feed coils based on two and three above.

In practice then in order to make more efficient coils, the Re resistance has to be reduced. The Re resistance is reduced by reducing the electrical length of the coil. This is accomplished by coupling the Rf coil at a pair of symmetrical points i.e. feeding each of the Rf coils at a pair of points instead of at one symmetrical point as done in the prior art. This reduction in electrical length makes it possible to increase the efficiency of the coil at the Rf frequencies used in MRI systems.

While the invention has been described in connection with particular exemplary embodiments, it is to be understood that the embodiments are presented by way of example only and not as a limitation on the scope of the invention.

What is claimed is:

1. A radio frequency (RF) coil of improved efficiency for magnetic resonant imaging (MRI) systems, said coil comprising:
   (a) loop means for generating magnetic fields transverse to a subject responsive to variations in the current therethrough;
   (b) said loop means comprising at least one conductor turn on each side of said subject;
   (c) each of said at least one conductor turn being divided into first and second locations substantially opposite to each other;
   (d) electromotive force (EMF) means for causing current to flow; and
   (e) coupling means for coupling said EMF means to said first and second section to cause current to flow in the same direction in said first and second sections of each of said at least one conductor turn and in the same direction in both of said at least one conductor turn whereby the magnetic fields generated by each of sections are additive while the length from the instantaneous positive to negative polarities of the EMF means is reduced by a factor of two relative to turns that are not divided into said sections.

2. The RF coil of claim 1 wherein said current varies at Larmor frequencies.

3. The RF coil of claim 1 wherein each of said first and second sections are of substantially equal resistivity.

4. The RF coil of claim 3 wherein said first and second sections are of substantially equal length.

5. The RF coil of claim 1 wherein locations on said first sections are at that same potential as diametrically opposite locations on said second sections.

6. The RF coil of claim 1 wherein the length from the instantaneous positive potential to the instantaneous negative potential of said EMF is the length of said sections individually.

7. The RF coil of claim 1 wherein said coupling means includes a double feed arrangement for coupling said EMF means to said first and second sections of each of said at least one conductor turn.

8. The RF coil of claim 7 wherein said coupling means further includes hybrid means to couple said EMF means to said double feed arrangement at balanced equal impedance at the outputs of said hybrid means.

9. The RF coil of claim 8 wherein said hybrid means comprises:
   (a) first and second output pairs, each comprising an instantaneous positive and negative output;
   (b) means for coupling the negative output of said first output pairs directly to one end of the first section of both of said at least one conductor turn on each side of said subject;
   (c) means for coupling the positive output of said first output pair to one end of said second section of both of said at least one conductor turn on each side of said subject including a first matching capacitor means;
   (d) means for coupling the negative output of said second output pairs to the other end of said second section of both of said at least one conductor turn on each side of said subject including a second matching capacitor means;
   (e) means for coupling the positive output of said second output pair directly to the other end of said second section of both of said at least one conductor turn;
   (f) a first tuning capacitor means coupled between the means for direct coupling the negative output of said first output pair to the one end of said first sections and the connection of the first matching capacitor means to the one end of said second sections; and
   (g) a second tuning capacitor means coupled between the means for direct coupling the positive output of said second output pair and the connection of said second matching capacitor means and the other end of said second sections.

10. The RF coil of claim 9 wherein said hybrid means comprises:
    (a) a pair of inductor means having one end thereof coupled together at a first point;
    (b) a bridging capacitor means joined to said pair of inductor means at second and third points to bridge the other ends of said pair of inductor means, respectively;
    (c) means for coupling the EMF means between said first point and electrical ground;
    (d) filter capacitor means separating said first point from electrical ground;
    (e) means for coupling said first matching capacitor means to said second point;
    (f) means for coupling said second matching capacitor means to said third point; and
    (g) said means for coupling directly being coupled to electrical ground.

11. The coil arrangement of claim 8 wherein said balance impendance is 50 ohms.

* * * * *